United States Patent [19]

Kim

[11] Patent Number: 4,626,474

[45] Date of Patent: Dec. 2, 1986

[54] POLYIMIDE FILM/METAL FOIL LAMINATION

[75] Inventor: Ki-Soo Kim, Katonah, N.Y.

[73] Assignee: Stauffer Chemical Company, Westport, Conn.

[21] Appl. No.: 747,541

[22] Filed: Jun. 21, 1985

[51] Int. Cl.⁴ .................. B32B 15/08; B32B 27/06; B32B 27/00

[52] U.S. Cl. .................. 428/416; 428/462; 428/473.5

[58] Field of Search .................. 428/416, 473.5, 462

[56] References Cited

U.S. PATENT DOCUMENTS

| | | | |
|---|---|---|---|
| 3,717,543 | 2/1973 | Sinclair et al. | 156/330 X |
| 3,904,813 | 9/1975 | Groff | 428/474 X |
| 3,981,691 | 9/1976 | Cuneo | 428/418 X |
| 4,295,912 | 10/1981 | Burns | 428/416 X |
| 4,525,542 | 6/1985 | De Gooyer | 428/416 X |

OTHER PUBLICATIONS

Chem. Ab., V. 87, #86048c (1977), Abstracting Japan Kokai, 77,65,576.

*Primary Examiner*—P. C. Ives
*Attorney, Agent, or Firm*—Richard P. Fennelly

[57] ABSTRACT

Polyimide films can be laminated to metal foils by the use of an epoxy adhesive composition which consists essentially of a predominant amount of an epoxy resin and a suitable curing agent for the epoxy resin. Optional additives which can be used in lesser amount than the epoxy resin includes flexibilizers, accelerators, solvents and surfactants.

10 Claims, No Drawings

POLYIMIDE FILM/METAL FOIL LAMINATION

BACKGROUND OF THE INVENTION

1. Field of the Invention

The present invention relates to the lamination of metal foils to polyimide films.

2. Description of the Prior Art

Polyimide films having an adherent metal foil layer have been described in the literature. Such laminates are useful as components for electrical circuitry.

U.S. Pat. No. 3,717,543 to J. R. Sinclair et al. describes the use of an epoxy resin-containing adhesive to bond polyimide films and metal foils. The Sinclair patent specifies that the adhesive contain at least 50% by weight of an ammoniated acrylic copolymer, e.g. of the methyl methacrylate-glycidyl methacrylate type.

U.S. Pat. No. 3,904,813 to G. L. Groff also describes the use of an adhesive composition containing epoxy resin to bond polyimide film and metal foil. The adhesive that is described in the Groff patent contains 100 parts by weight of a completely reacted adduct of a carboxyl-terminated polymer and an epoxy compound. Additionally, the adhesive contains between about 25 and 200 parts by weight of an epoxy resin and sufficient epoxy curing agent.

Neither of the above patents describes adhesive compositions containing a predominant amount of epoxy resin without the large amounts of polymeric modifier used in the Sinclair et al. and Groff technology.

SUMMARY OF THE INVENTION

The present invention relates to polyimide film/metal foil lamination using an epoxy resin adhesive which contains a predominant amount of epoxy resin and an epoxy curing agent. The adhesives do not contain the large amounts of modifier components of the type described by Sinclair et al. and Groff in the above-mentioned patents. If desired, the epoxy adhesive composition used in the present invention can be modified with an amount of polymeric flexibilizer, for example, which is significantly less than the amount of epoxy resin that is utilized.

DETAILED DESCRIPTION OF THE PRESENT INVENTION

It has been unexpectedly found that it is possible to laminate polyimide films and metal foils to one another using an epoxy adhesive composition which consists essentially of a predominant amount of epoxy resin and an epoxy curing agent. Generally speaking, the amount of epoxy resin that is used in the adhesive will be greater than about 60 percent. The amount of any polymeric flexibilizing additives that are used will generally be no greater than about 30 percent.

The epoxy resin which forms a major portion of the adhesive used in connection with the present invention includes the glycidyl polyethers of polyhydric phenols which are derived from an epihalohydrin, e.g., epichlorohydrin, and a polyhydric phenol. Examples of such polyhydric phenols include resorcinol, hydroquinone, bis(4-hydroxyphenyl)-2,2-propane, or bisphenol A as it is commonly called, 4,4'-dihydroxybenzophenone, bis(4-hydroxyphenyl)-1,1-ethane, bis(4-hydroxyphenyl)-1,1-isobutane, bis(4-hydroxyphenyl)2,2-butane, bis(2-dihydroxynaphthyl)methane, phloroglucinol, and bis(4-hydroxyphenyl)sulphone. Additional polyhydric phenols are novolac resins containing more than two phenol, or substituted phenol, moieties linked through methylene bridges as well as halogenated, e.g., brominated and chlorinated, phenolic compounds. These types are known to persons of ordinary skill in the art as suitable epoxy resin compositions.

A preferred epoxy resin for use in the adhesive of the present invention is available from Shell Chemical Company under the trademark EPON 828. It is a low molecular weight epichlorohydrin bisphenol A type having an epoxy equivalent weight of about 190. Generally speaking, the preferred range for this adhesive will be anywhere from about 60% by weight up to close to 100% by weight, with the balance being curing agent and optional accelerator.

The epoxy curing agent which is suitable for use in the present invention include those curing agents having a sufficient degree of amine functionality to cure the epoxy resin. Such conventional curing agents as dicyandiamine, m-phenylenediamine, 4,4'-methylenedianiline, diaminodiphenyl ether, aromatic amine eutectics, and diaminopdiphenyl sulfone can be utilized. Generally speaking, the amount of curing agent which is effective in terms of the present invention will range from about 5 percent to about 30 percent.

The adhesive that are used in conjunction with the present invention can also include a number of optional additives as illustrated, for example, in the Examples attached hereto.

One class of optional additive is an accelerator for the curing agent. This additive can generally be used at from about 0.1% to about 2% and includes such accelerators as benzyldimethylamine and boron trifluoride monoethylamine.

If increased flexibility of the epoxy adhesive is desired, it is possible to incorporate a flexibilizer in the composition at up to about 30% by weight of the composition. Included as possible flexibilizers are aliphatic epoxy resins or epoxy-carboxy terminated butadiene nitrile resins. Such additives are particularly useful in environments where flexibility might be an important prerequisite.

The adhesive composition can also include small amounts of solvent to make the composition more workable as well as surfactants and other optional additives in relatively minor amount (e.g., 2% to 20%).

The laminates of the present invention are formed by suitably coating either the polyimide film or the metal foil with the adhesive composition followed by the lamination of the polyimide film and the metal foil. This lamination procedure forms a laminate intermediate which is capable of being cured by the application of heat to cure the adhesive. The curing of the adhesive forms the final polyimide film/metal foil laminate which can find end use applicability in the electronics field, for example.

The foregoing general description of the present invention is further illustrated with the Examples which follow.

EXAMPLE 1

Diepoxide resin (Shell EPON 828 brand), 100 gm, was mixed with 6 gm of dicyandiamide epoxy curing agent, and 0.5 gm of benzyldimethylamine accelerator. The composition had a Brookfield viscosity of 13,000 cps at room temperature. The adhesive formulation was coated onto polyimide film (DuPont KAPTON 300H brand), was laminated to one ounce electrodeposited copper foil, and was cured for 1 hour at 163° C. and 2.2 tons pressure. It gave a strong polyimide to copper bond for the laminate. The polyimide film was difficult to separate by hand without splitting or tearing it.

EXAMPLES 2 AND 3

Following the procedure of the Example 1, various epoxy adhesive compositions were formulated. The adhesives, when dried, at 130° C. for 5 minutes and cured at 163° C. at 1.1 tons pressure for 1 hour, all gave strong polyimide to copper bonding. The T-peel strength for the bond was measured using an INSTRON tensile tester. Variations in the compositions and the results of thermal analysis of the cured compositions are shown in Table I.

TABLE I

|  | Example No. | |
| --- | --- | --- |
|  | 2 | 3 |
| Diepoxide resin (Shell EPON 828), gm | 70 | 70 |
| Aliphatic epoxy resin (Shell EPON 871), gm | 30 | — |
| Epoxy-CTBN* adduct (Wilmington Chemical HELOXY WC-8006), gm | — | 30 |
| Dicyandiamide, gm | 6 | 6 |
| Benzyldimethylamine, gm | 0.5 | 0.5 |
| Toluene, gm | 2.5 | 15 |
| Brookfield Viscosity, cps at room temp. | 3,000 | 2,300 |
| Weight loss, % at 350° C. | 5 | 4 |
| Copper/polyimide bond peel strength (KN/m) | 0.3 | 0.3 |

*CTBN designates a carboxyl-terminated polybutadiene/acrylonitrile resin.

EXAMPLE 4

A mixture of 99 gm of epoxy resin (Shell EPON 828 brand), 30 gm of diaminodiphenylsulfone curing agent, 16.5 gm of ethylene glycol monomethyl ether (methyl CELLOSOLVE brand) was heated with stirring at 80°-90° C. to obtain a homogeneous solution. It was then cooled to 40°-50° C. To this was added 0.6 gm of 10% fluorocarbon surfactant (3M FC430 brand) in ethylene glycol monomethyl ether (methyl CELLOSOLVE brand) and 1 gm of boron trifluoride monoethylamine in 1 gm of the ethylene glycol monomethyl ether. It was thoroughly mixed. The adhesive formulation had a Brookfield viscosity of 2,900 cps at 25° C. the adhesive was coated on 1 oz electrodeposited copper foil with #40 wire wound rod applicator and was dried for 10 minutes at 107° C. The adhesive thickness was 0.046 mm (1.8 mil). The coated foil was then stacked against polyimide film (DuPont KAPTON 300H brand) and was pressed for one hour at 177° C. and 8 tons pressure. A T-Peel strength of 7.5-8.5 lbs/in (1.3-1.5 KN/m) was measured using an INSTRON tensile tester at a separation rate of 1.27 cm per minute. Use of a higher separation rate rendered the polyimide film difficult to separate without tearing it. Samples of the copper-clad sheeting were subjected to a solder resistance test at 660° F. (350° C.) for one minute. No blistering appeared in the base polyimide film or copper foil.

EXAMPLE 5

This Example illustrates use of the adhesive composition shown in Example 4 to prepare a thin continuous copper layer on a polyimide film.

The liquid adhesive formulation was coated on the metallic side of copper-sputtered (1 millimicron thick), silicone release-coated, polyethylene terephthalate polyester film. The adhesive coated samples were dried for 10 minutes at 107° C. The adhesive had a thickness of 0.025 mm (1 mil). It was then stacked against polyimide film (DuPont KAPTON 300H brand) and pressured for 1 hour at 177° C. and 8 tons pressure. After curing, the polyester film was removed with an excellent transfer of the copper onto the polyimide film.

EXAMPLES 6-8

Following the procedure of the Example 4, various epoxy adhesive compositions were prepared. When dried at 120° C. for 5 minutes and cured 1 hour at 167° C./0.45 ton pressure, all gave strong polyimide to copper bonding. The resulting composite was difficult to separate by hand without splitting or tearing it. Variations in the compositions and the results of thermal analysis of the cured adhesive compositions are shown in Table II.

TABLE II

|  | Example No. | | |
| --- | --- | --- | --- |
|  | 6 | 7 | 8 |
| Diepoxy resin (Shell EPON 828), gm. | 45 | — | 90 |
| Epoxy novolac resin (Ciba-Geigy ECN 1235), gm | 45 | 90 | — |
| Diaminodiphenyl sulfone, gm | 27 | 27 | 27 |
| Methyl Cellosolve brand, gm. | 21 | 21 | 15 |
| Boron trifluoride monoethylamine, gm | 1 | — | 1 |
| Benzyldimethylamine, gm. | — | 0.5 | — |
| Viscosity, cps at 25° C. | 3,700 | 5,600 | 3,300 |
| Weight loss, % at 350° C. | 1.5 | 1.0 | 1.5 |
| Copper/polyimide bond strength | strong | strong | strong |

The foregoing Examples are set forth to merely illustrate certain preferred embodiments of the present invention. These should not be taken as limiting. The scope of protection that is sought is set forth in the claims which follow.

I claim:

1. A laminate intermediate adapted to be cured to form a laminate, said laminate intermediate comprising:
    (a) a polyimide film;
    (b) a metal foil; and
    (c) a curable adhesive layer which lies between (a) and (b), the curable adhesive layer consisting essentially of a predominant amount of a curable epoxy resin, substantially no flexibilizer, and an epoxy curing agent for the epoxy resin.
2. A laminate intermediate as claimed in claim 1 wherein the metal foil is copper.
3. A laminate intermediate as claimed in claim 1 wherein the adhesive comprises an epichlorohydrin bisphenol A resin.
4. A laminate intermediate as claimed in claim 1 wherein the metal foil is copper and the adhesive comprises an epichlorohydrin bisphenol A resin.
5. A laminate intermediate as claimed in claim 1 which further comprises up to about 30% by weight of the adhesive, of a flexibilizer.
6. A laminate comprising:
    (a) a polyimide film;
    (b) a metal foil; and
    (c) a cured adhesive layer between (a) and (b) bonding (a) and (b) to one another, the adhesive layer consisting essentially of a predominant amount of a cured epoxy resin and substantially no flexibilizer.
7. A laminate as claimed in claim 6 wherein the metal foil is copper.
8. A laminate as claimed in claim 6 wherein the adhesive comprises an epichlorohydrin bisphenol A resin.
9. A laminate as claimed in claim 6 wherein the metal foil is copper and the adhesive comprises an epichlorohydrin bisphenol A resin.
10. A laminate as claimed in claim 6 which further comprises up to about 30% by weight of the adhesive of a flexibilizer.

* * * * *